(12) United States Patent
Ruha et al.

(10) Patent No.: US 6,507,171 B2
(45) Date of Patent: Jan. 14, 2003

(54) METHOD AND APPARATUS FOR MEASURING BATTERY CHARGE AND DISCHARGE CURRENT USING A DIRECT ANALOG-TO-DIGITAL CONVERSION OF A CHARGE/DISCHARGE REPLICA CURRENT

(75) Inventors: Antti Ruha, Oulu (FI); Tarmo Ruotsalainen, Oulu (FI); Jussi-Pekka Tervaluoto, Oulu (JP); Jani Kauppinen, Oulu (JP)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/029,744

(22) Filed: Dec. 21, 2001

(65) Prior Publication Data

US 2002/0084772 A1 Jul. 4, 2002

Related U.S. Application Data

(63) Continuation-in-part of application No. 09/772,249, filed on Jan. 29, 2001.
(60) Provisional application No. 60/259,110, filed on Dec. 29, 2000.

(51) Int. Cl.$^7$ .......................... H01M 10/44; H01M 10/46
(52) U.S. Cl. ........................................ 320/128; 320/137
(58) Field of Search .................. 320/127, 128, 320/132, 135, 137, 157, 162, 164

(56) References Cited

U.S. PATENT DOCUMENTS 5,119,011 A  *  6/1992  Lambert
5,672,951 A  *  9/1997  Shiota
6,064,185 A  *  5/2000  Ohno
6,407,532 B1 *  6/2002  Ruha

* cited by examiner

*Primary Examiner*—Edward H. Tso
(74) *Attorney, Agent, or Firm*—Harrington & Smith, LLP

(57) ABSTRACT

Disclosed is a method for charging a battery and circuitry for performing the method. The method includes steps of: (A) generating at a first node a battery charge current (Icharge) for charging the battery; (B) generating at a second node a replica current (Irep) from Icharge, where Irep<Icharge; and (C) operating a closed loop current sink for sinking Irep, where a digital output of said closed loop current sink is a measure of the magnitude of Icharge. In the preferred embodiment the digital output is input to a control circuit for controlling the generation of Icharge. Also in the preferred embodiment the closed loop current sink is constructed from a multi-stage DAC that is driven by an output of an n-level digital filter that is incremented or decremented as a function of a voltage difference between the first node and the second node. Preferably the multi-stage DAC is a multi-stage current steering DAC, and the n-level digital filter is constructed using an up/down counter. A selection of stages of the multi-stage DAC to be turned off and on is made by a DEM logic block that is interposed between the output of the counter and the multi-stage DAC. The disclosed circuitry and method may be extended for providing a battery discharge measurement circuit for enabling a battery capacity test to be performed.

21 Claims, 7 Drawing Sheets

METHOD AND APPARATUS FOR MEASURING BATTERY CHARGE AND DISCHARGE CURRENT USING A DIRECT ANALOG-TO-DIGITAL CONVERSION OF A CHARGE/DISCHARGE REPLICA CURRENT

CROSS-REFERENCE TO A RELATED PATENT APPLICATION

This patent application is a continuation-in-part of copending U.S. patent application Ser. No. 09/772,249, filed on Jan. 29, 2001, entitled Method and Apparatus for Measuring Battery Charge and Discharge Current, by Antti Ruha, the disclosure of which is incorporated by reference herein in its entirety.

CLAIM OF PRIORITY FROM A COPENDING PROVISIONAL PATENT APPLICATION

Priority is herewith claimed under 35 U.S.C. §119(e) from copending provisional patent application number 60/259,110, filed on Dec. 29, 2000, entitled Method and Apparatus for Measuring Battery Charge and Discharge Current, by Antti Ruha, the disclosure of which is incorporated by reference herein in its entirety.

FIELD OF THE INVENTION

This invention relates generally to battery charging circuitry and methods and, more particularly, relates to methods and apparatus for measuring a battery charging current, as well as a battery discharging current.

BACKGROUND OF THE INVENTION

A battery charging circuit of most interest to these teachings is one used with a wireless terminal, also referred to as mobile station or as a personal communicator. During a charging operation a relatively high current is required to be measured and monitored, typically in the range of several hundred milliamps (mA) or even more. Referring to FIG. 1, conventional practice places a series resistance (Rmeas) between a source of charging current, shown as a charger 1, and the associated charger switch (Msw) 2. Msw is coupled to the battery 3 to be recharged. The battery charging current (Ich) flows through Rmeas, and the resulting voltage drop (Vmeas) across Rmeas is sensed for controlling the charging cycle. For example, an analog-to-digital converter (ADC) 4 may be used to convert Vmeas to an a digital representation, which in turn may be used to modulate the pulse width of a signal output from a pulse width modulator (PWM) 5. Vmeas may also be employed as a measurement of the battery voltage. The output of the PWM 5 can be used directly, or it can be further modified by a charging controller 6, to provide a switching signal (Vcntrl) to Msw. In this way the conduction through Msw is varied so that as the battery 3 reaches full charge the on-time of Msw can be gradually reduced until finally Msw is supplying only a maintenance (trickle) charge to the battery 3. In other embodiments the feedback loop from Rmeas to Vcntrl could be implemented in an entirely analog fashion, or in a mixed analog/digital fashion.

One significant drawback to the use and operation of this type of conventional charging circuit is that Rmeas is required to be a low ohmic value, high precision resistor. Due to the significant current flow through Rmeas it must also be large physically in order to dissipate the resulting heat. The use of a physically large resistor implies that a separate, discrete component be used, as opposed to an integrated component, which increases the cost as well as the complexity of the manufacturing and testing operations. Furthermore, Rmeas must be carefully located so as not to excessively heat adjacent circuit components. In addition, because of the low ohmic value of Rmeas the resulting voltage drop Vmeas is also small, which can require the use of high resolution ADC 4 to obtain an accurate measurement of Ich.

Copending U.S. patent application Ser. No. 09/772,249, filed on Jan. 29, 2001, entitled Method and Apparatus for Measuring Battery Charge and Discharge Current, by Antti Ruha (incorporated by reference herein in its entirety, and hereinafter referred to simply as the parent application), discloses various embodiments of circuitry that enable the resistance Rmeas to be eliminated and to relax the ADC conversion range. It is thus desirable to provide even further improvements to simplify the current measurement and conversion functions.

OBJECTS AND ADVANTAGES OF THE INVENTION

It is a first object and advantage of this invention to provide an improved battery energy management circuit.

It is another object and advantage of this invention to provide an improved battery charging circuit for use in a wireless terminal that overcomes the foregoing and other problems, and that provides a direct analog-to-digital conversion function whereby a value of the charge/discharge current can be realized in a digital fashion.

It is a further object and advantage of this invention to provide an improved battery discharging circuit for use in making battery capacity and other types of measurements.

SUMMARY OF THE INVENTION

The foregoing and other problems are overcome and the foregoing objects and advantages are realized by methods and apparatus in accordance with embodiments of this invention.

The invention provides a circuit for measuring battery charge current and converting the measurement directly into a digital value. As the current is digitized directly to digital values no separate current-to-voltage and voltage-to-digital conversion stages or processes are required, thereby conserving integrated circuit area, cost and complexity.

Additional savings can be achieved as the current-to-digital converter can be realized without using external (high power) resistors. Furthermore, the circuit can be realized without requiring the use of accurate (precision) integrated resistors or capacitors, enabling lower cost integrated circuit processes to be employed.

In this invention the conversion is based on the sigma-delta conversion principle, except for the measurement and the data conversion that are performed in the current domain. In this invention a mirrored and scaled-down replica (in the average sense) of the charging current is generated with a (sigma-delta) feedback loop. Simultaneously, and as a result of the function of the sigma-delta feedback loop, an over-sampled coarse digital representation of the value of the battery charge current is generated. The digital representation of the battery charge current may be low-pass filtered and decimated to increase the overall measurement accuracy.

The use of the teachings of this invention results in a simpler, more compact and more cost-effective solution to the battery current measurement problem than those currently in use. The component accuracy requirements are relaxed, and no external or integrated resistors of high accuracy (or capacitors) are required or used in the measurement circuitry. The avoidance of external components reduces material and assembly costs. The relaxation in the resistor (or capacitor) accuracy reduces cost by reducing the integrated circuit process complexity required (the resistor processing steps are not required). In that no accurate resistors are required, the battery charge current measurement circuitry, due to the sigma-delta and over-sampling principles, relies more on the (moderate) component matching that is intrinsically obtained with conventional integrated components. The overall saving in silicon area made possible by the use of this invention can be significant when compared to, for example, an approach that uses a 10-bit ADC in combination with a resistor network of 10-bit accuracy.

An important aspect of this invention resides in the avoidance of the intermediate conversion of a current to be measured to a voltage (achieved by flowing the current through a resistor), as the current to be measured is directly converted to a digital value. This approach significantly reduces the amount of circuitry and circuit area that is required.

Disclosed herein is a method for charging a battery and circuitry for performing the method. The method includes steps of: (A) generating at a first node a battery charge current (Icharge) for charging the battery; (B) generating at a second node a replica current (Irep) from Icharge, where Irep<Icharge; and (C) operating a closed loop current sink for sinking Irep, where a digital output of said closed loop current sink is a measure of the magnitude of Icharge. In the preferred embodiment the digital output is input to a control circuit for controlling the generation of Icharge.

Also in the preferred embodiment the closed loop current sink is constructed from a multi-stage DAC that is driven by an output of an n-level digital loop filter having a value that is a function of a voltage difference between the first node and the second node. A presently preferred implementation of the digital loop filter employs an n-level up/down counter that counts up or down as a function of the voltage difference between the first node and the second node. Preferably the multi-stage DAC is a multi-stage current steering DAC. A selection of stages of the multi-stage DAC to be turned off and on is made by a DEM logic block that is interposed between the output of the counter and the multi-stage DAC.

The disclosed circuitry and method may be extended for providing a battery discharge measurement circuit for enabling a battery capacity test to be performed.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE PREFERRED EMBODIMENTS

Figure 1:
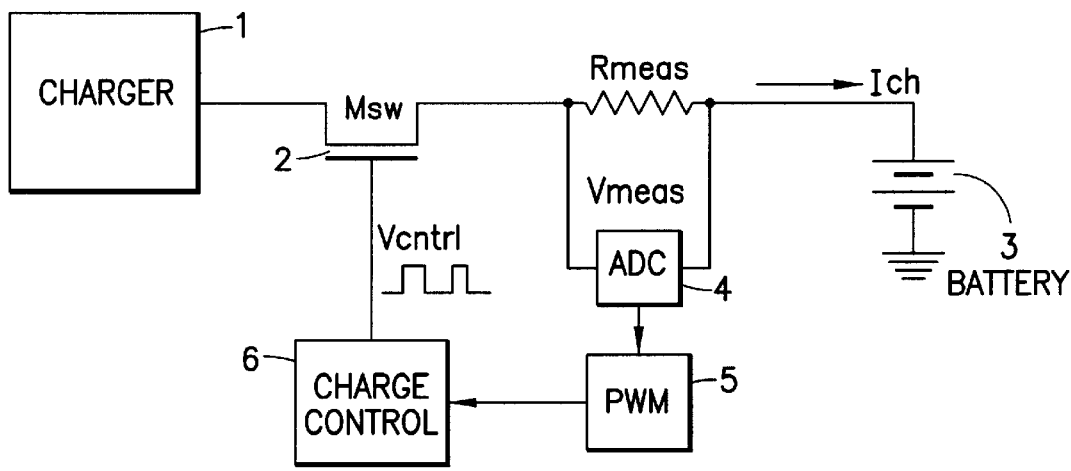
FIG. 1 is a circuit diagram, partially in block diagram form, that depicts a conventional battery charger arrangement.
Figure 2:
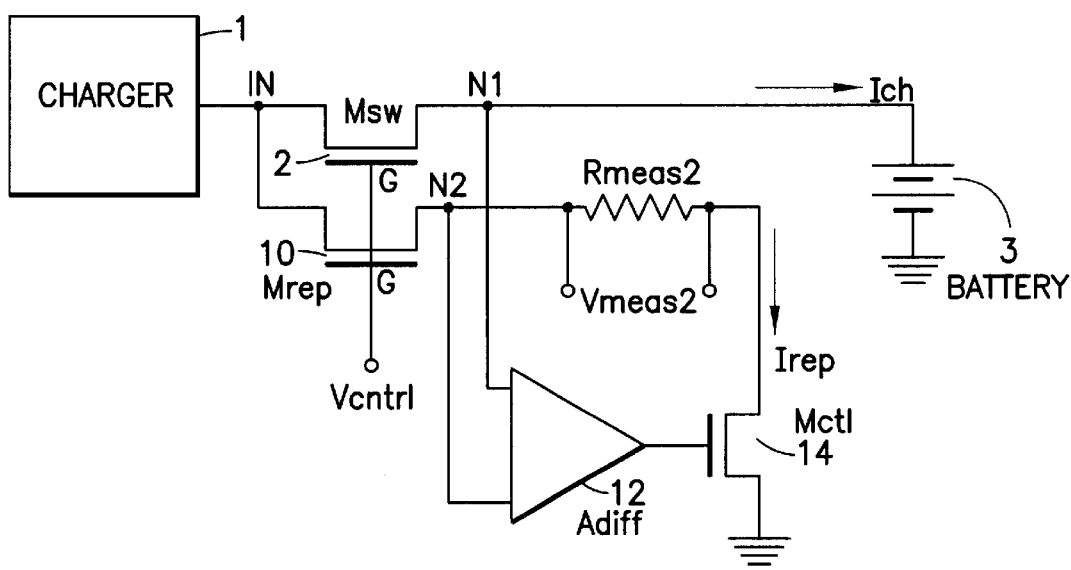
FIG. 2 is a circuit diagram, partially in block diagram form, that depicts a battery charger circuit in accordance with the teachings of the parent application.

By way of introduction, reference is first made to FIG. 2 for showing a circuit diagram, partially in block diagram form, of a battery charger circuit in accordance with the teachings of the parent application. Elements that are also found in FIG. 1 are numbered accordingly.

FIG. 2 a scaled down replica of the charging current Ich, designated Irep, is generated with the aid of a servo-control circuit embodied as components Mrep 10, Adiff 12 and Mctl 14. The current Irep, not Ich, is passed through a measurement resistor Rmeas2. The replica of the charging current Irep is an accurate representation of the actual charging current Ich, as Msw 2 and Mrep 10 have the same terminal potentials at their respective input nodes, as well as at their respective output nodes (N1 and N2). That is, both of the transistors Msw 2 and Mrep 10 see the same voltage at their input terminal and at their gate (G) terminal (or Vcntl), and their respective outputs (N1 and N2) are at the same voltage potential due to the feedback formed by the servo-circuit. More particularly, the differential amplifier Adiff 12, which outputs a difference signal representing the difference between the potentials appearing at nodes Ni and N2, in combination with transistor Mctl 14, forces the potential at node N2 to equal the potential at node Ni. As a result, Irep equals Ich/N, where N is a scaling factor or ratio that is described next.

The current scaling is achieved by reducing the size (the channel Width/Length ratio of a MOS transistor) of the current replicating transistor or device Mrep 10 by the scaling factor or ratio N with respect to the Width/Length ratio of the charging transistor or device Msw 2. In general, N is greater than unity. Preferably, N is greater than about 10, and more preferably is greater than about 100. Most preferably, the scaling factor or ratio (N) is in a range on the order of, for example, about 100 to about 1000.

Since the current scales linearly with the transistor channel geometry and assuming, by example, a scaling factor of 500: for a 200 mA charging current Ich the replication current Irep is only 400 micro amps (400 $\mu$A). This significant reduction in current flow through the measurement or sense resistance Rmeas2 enables a significantly larger ohmic value to be used for Rmeas2 (relative to the prior art circuit of FIG. 1), and further provides significantly less power dissipation. For example, a value of 1.5 k$\Omega$ for Rmeas2 yields a value of 600 mV for Vmeas2, assuming a value for Irep of 400 $\mu$A. A 10-bit ADC 4 is thus clearly suitable for accurately digitizing the magnitude of Vmeas2, and its implementation is facilitated by due to the increased voltage to be measured.

This procedure also enables a significantly smaller sized physical resistance element to be employed. The use of a smaller physical resistor element enables the resistor to be integrated into, for example, an energy management integrated circuit, thereby eliminating the requirement to provide a separate physical resistor. When the integrated resistance is employed for Rmeas2 it maybe desirable to provide either analog/resistor calibration or digital calibration of the output of the ADC 4.

In various embodiments the charging transistor Msw, the current replication transistor Mrep and the control device Mctl can be NMOS-type devices, or PMOS-type devices, and may further be either NPN or PNP devices. With bipolar junction transistors (BJTs) the replica current scaling is achieved with appropriate ratioing of the charging transistor Msw and the current replication transistor Mrep emitter areas. All of these variations can be made to function according to these teachings by providing the corresponding suitable polarity for the differential amplifier Adiff 12. The optimum choice of device type is, in general, application and semiconductor technology dependent.

In the embodiment shown in FIG. 2 a floating sense amplifier (not shown) is preferably employed for buffering Vmeas2 prior to application to the ADC 4 (shown in FIG. 1).

Figure 3:
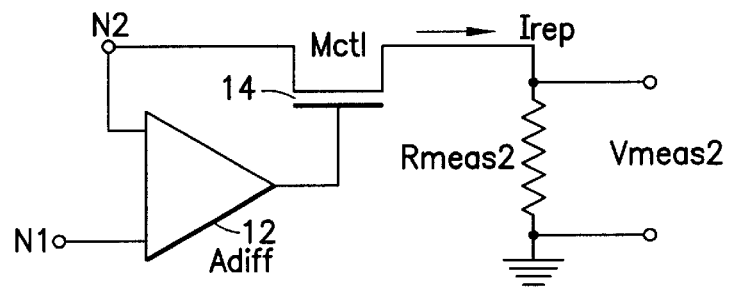
FIG. 3 shows an alternate configuration of the measurement resistor and servo loop transistor Mctl of FIG. 2.

The position of the measurement resistor Rmeas2 and the control device Mctl can also be interchanged to realize a single-ended measurement of Vmeas2, as depicted in the embodiment shown in FIG. 3.

The following Table is useful in explaining the distinctions between the conventional charger arrangement shown in FIG. 1 and the charger arrangement of FIG. 2.

TABLE

Power Dissipation in Measurement Resistors and
AD Conversion Voltage Range (FIG. 1)

Power dissipation in Rmeas: Pdis=Ich*Ich*Rmeas
Voltage range: Vrange=Ich*Rmeas

Power Dissipation in Measurement Resistors and
AD Conversion Voltage Range (FIG. 2)

Power dissipation in Rmeas2: Pdis=Ich/N*Ich/N*Rmeas*M=Irep*Irep*Rmeas2
Voltage range: Vrange=Ich/N*Rmeas*M=Irep*Rmeas2

In the presently preferred embodiment the power dissipation in the measurement resistor (Rmeas2) and the voltage range can be chosen independently using the scaling of the current replication transistor Mrep 10 (by N) and the measurement resistor Rmeas2 (by M). It is thus possible to simultaneously realize a low power dissipation and a wide voltage range by selecting the scaling factors accordingly. The low power dissipation in Rmeas2 enables a physically smaller sized external or integrated resistor to be used, while the increased measurement voltage range relaxes the offset and accuracy requirements of the sense amplifier and the ADC 4 converter. A suitable number of bits of resolution for the ADC 4 is 10 bits, although more or less than 10 bits can be employed.

Figure 4:
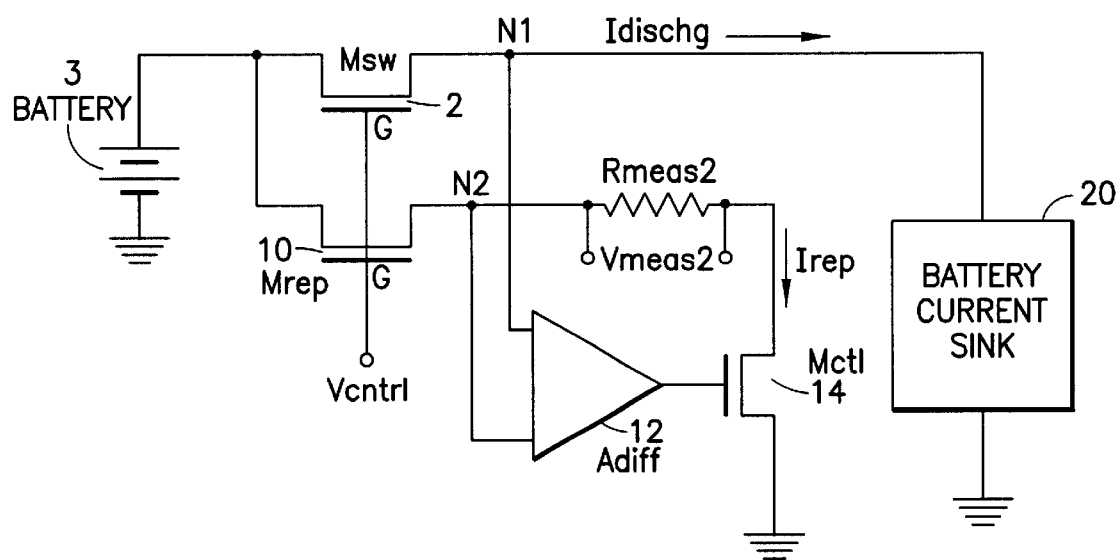
FIG. 4 is a circuit diagram, partially in block diagram form, that depicts a battery discharge circuit in accordance with the teachings of the parent application.

Referring now to FIG. 4, it should further be appreciated that these teachings apply as well to techniques for performing a discharge test on the battery 3, wherein the battery 3 sources current towards a circuit to be powered 20 which functions as a current sink for the current sourced by the battery 3. In all other respects the discharge circuit can be constructed in accordance with the embodiment shown in FIG. 2, or in accordance with the single-ended measurement embodiment shown in FIG. 3. During the discharge test the measurement resistance Rmeas2 is used to sense the battery discharge current (Idisch), which is reflected in the magnitude of Vmeas2. The discharge current, in combination with a measurement of the voltage across the battery 3, is useful for predicting the amount of battery capacity that remains. In this embodiment the battery discharge current can be reduced, if needed, during the discharge test.

It is pointed out that the charger transistor or device Msw and the replication transistor or device Mrep can be operated by Vcntrl in a switched fashion so that they are turned on and off by Vcntrl. However, it is also within the scope of these teachings to operate charger transistor or device Msw and the replication transistor or device Mrep in their linear modes (i.e., not switched off and on). In this case Vcntrl is generated as a DC voltage with an adjustable voltage value to vary the conduction through Msw and Mrep. However, this latter option may be less desirable for some applications, as operation in the linear mode will generally consume more power and generate more heat than operation in the switched mode, as is well known.

Having thus reviewed the disclosure of the parent patent application, a description is now provided of additional embodiments in accordance with the teachings of this invention.

Figure 5:
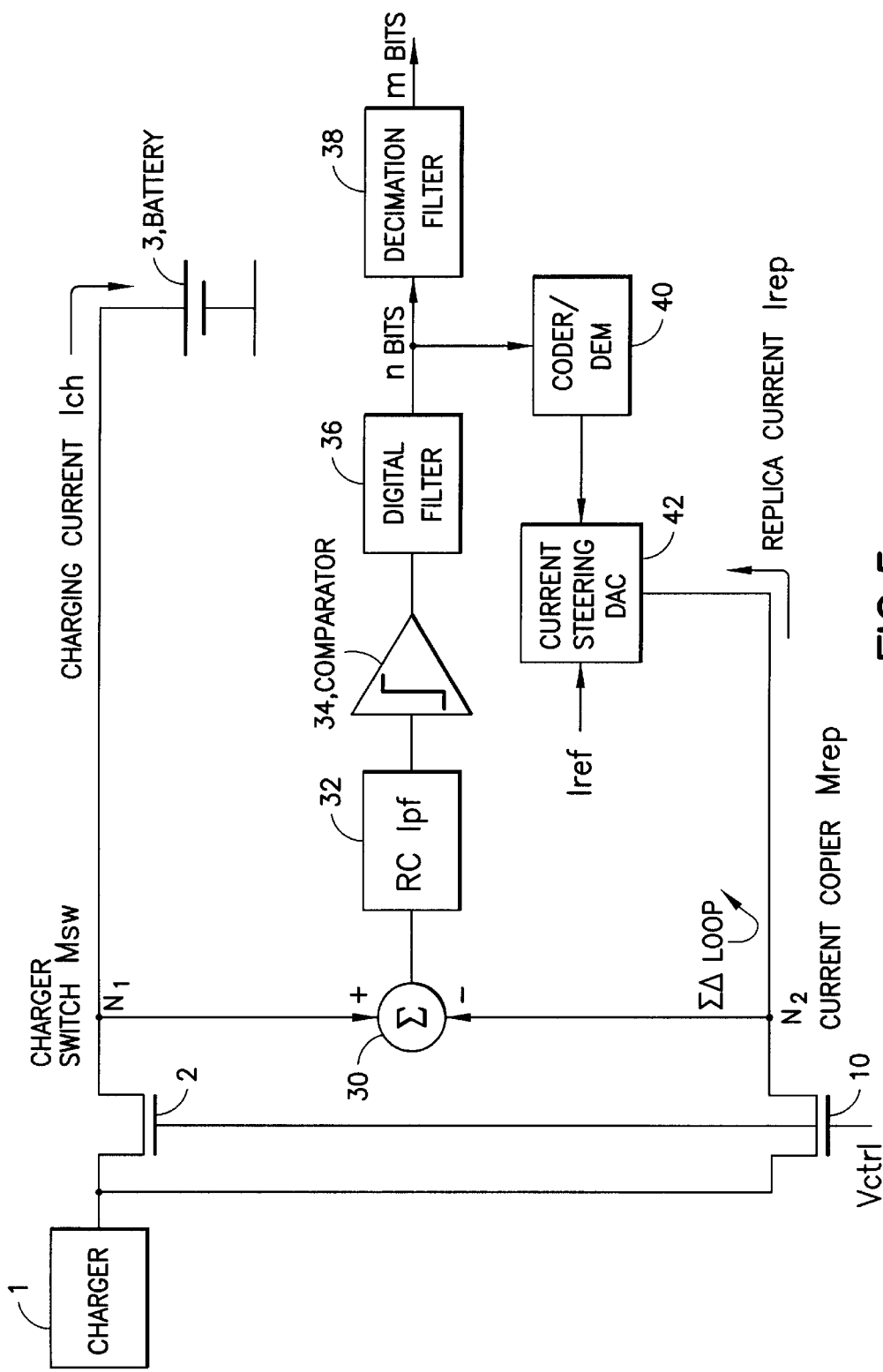
FIG. 5 is a block diagram of current measurement circuitry in accordance with this invention, wherein a replica of a current to be measured is digitized directly.

Reference is now made to FIG. 5 for showing a circuit diagram, partially in block diagram form, of a battery charger circuit in accordance with the teachings of this invention. Elements that are also found in FIGS. 1, 2, 3 and 4 are numbered accordingly.

In the presently preferred embodiment of the charge current measurement circuit a scaled down replica of the charging current is generated with the aid of a sigma-delta loop 28 containing current replication or copier transistor Mrep 10, a low pass filter (lpf) 32 fed from a summing junction 30, a comparator 34, a digital filter 36, a coder/Dynamic Element Matching (DEM) block 40, and a current steering DAC 42. An accurate (and scaled down) replica of the charging current Irep is generated and flows through the current copier transistor (Mrep) 10, when the devices Msw 2 and Mrep 10 have the same terminal potentials. Both of these devices have the same voltage at the input terminal and at the gate terminal, and the output terminal of Mrep 10 is forced to be at the same potential as that of Msw 2 (in an average sense).

The current scaling is achieved by making the size (W/L ratio) of the Mrep 10 to scaled down by a factor of N with respect to the charging switch Msw 2, as was described above. The charging switch Msw 2 and the current copier transistor Mrep 10 may be either NMOS or PMOS (NPN or PNP) types. The feedback DAC 42 may be implemented using either NMOS or PMOS (NPN or PNP) devices, for example, in the current steering structure shown in FIG. 7. All of these variations in the design can be made to function according to these teachings by providing suitable polarities of the signal voltages and currents. The optimum choice of device types is application and semiconductor technology dependent, as will be appreciated by those skilled in the art.

Figure 6A:
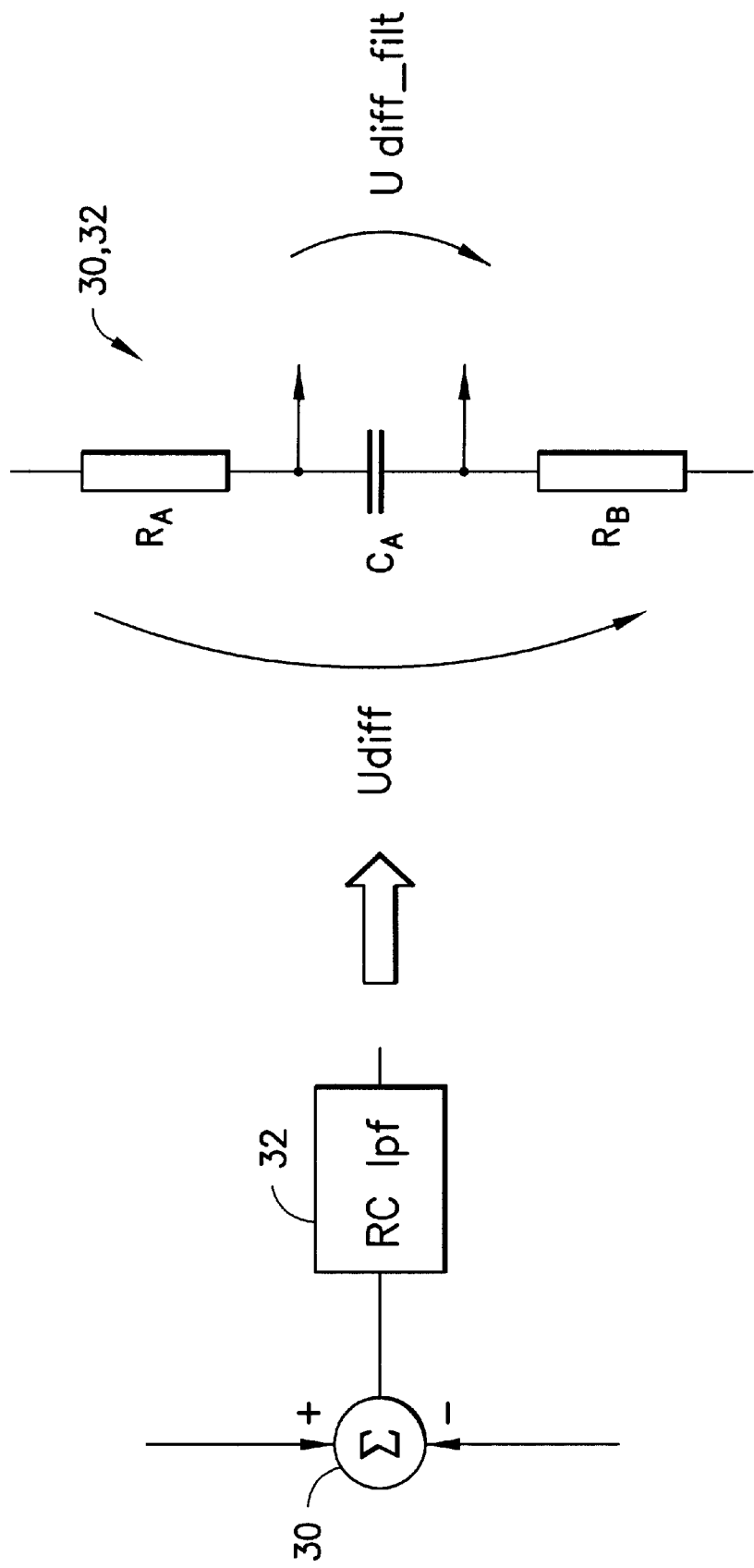
FIGS. 6A, 6B and 6C each depict an embodiment of the lowpass filter block of FIG. 5, specifically a simplest resistor/capacitor (RC) version, an active RC version and a switched capacitor (SC) version, respectively.
Figure 6B:
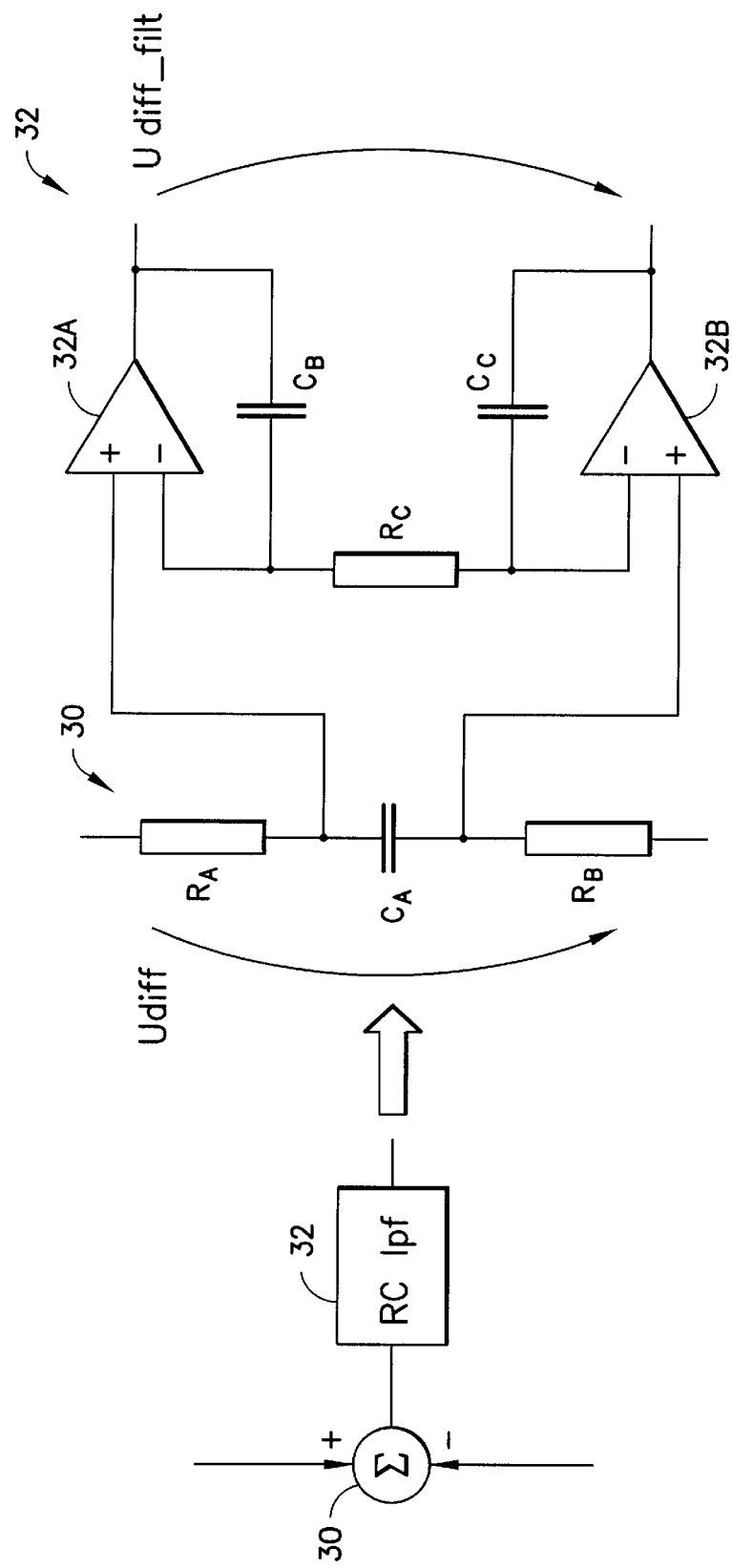

The low pass filter (lpf) 32 smooths out and averages the voltage differences (Udiff) between the output terminals (N1 and N2) of Msw 2 and Mrep 10, producing Udiff_filtered. The lpf 32 can be either single ended or differential in construction. The lpf 32 may be simply a differential passive RC network as shown in FIG. 6A, where it is comprised of summing node 30 resistors $R_A$ and $R_B$ in combination with capacitor $C_A$, or it may be implemented with an active RC filter of first or higher order (to improve the performance of the measurement sigma-delta loop), as shown in FIG. 6B. In FIG. 6B the differential RC lpf 32 includes amplifiers 32A, 32B, in combination with feedback network $R_c$, $C_B$ and $C_C$.

Figure 6C:
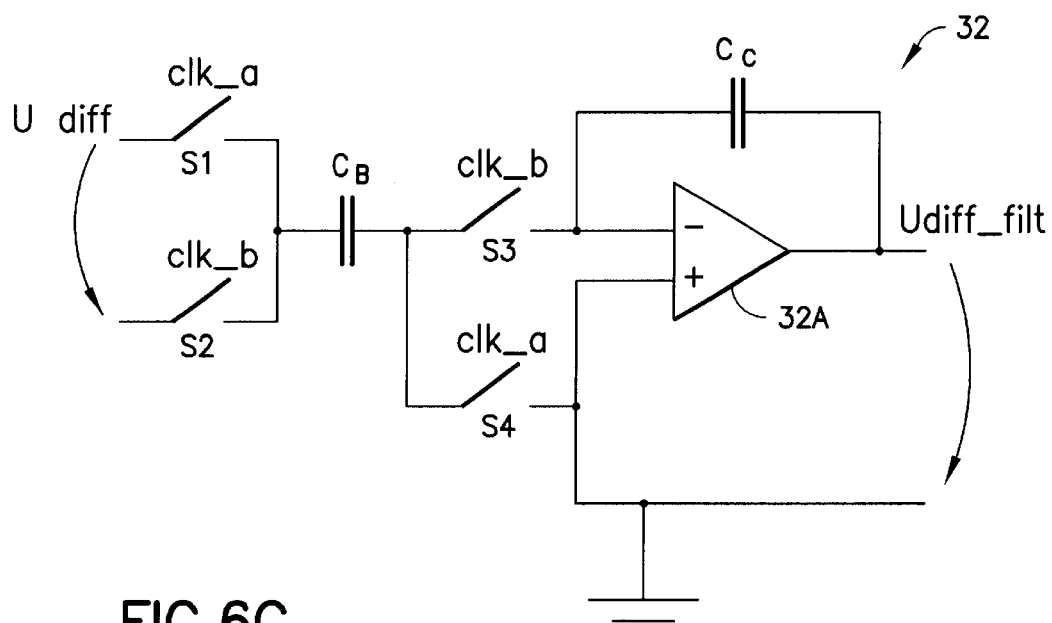

In a further embodiment of this invention shown in FIG. 6C the summing node 30 and the lpf 32 is not an RC structure at all, but is instead a switched capacitor (SC) embodiment constructed with phase clock a (clk_a) switches S1 and S4, phase clock b (clk_b) switches S2 and S3, capacitors $C_B$ and $C_C$, and amplifier 32A. The construction and operation of such active RC and SC based low pass filters, in both single ended and differential topologies, is well known in the art.

For the RC lpf embodiments of FIGS. 6A and 6B the accuracy of the resistors need not to be high, but the resistors are preferably matched to within a few percent (depending on the desired measurement accuracy). Resistor matching to within a few percent is readily achieved when the resistors are integrated using typical integrated circuit layout techniques. A mismatch results in a gain error that can be calibrated either in the analog or the digital domain if high accuracy is required. No special resistor layers in a silicon process are required, and conventional well-type or diffusion-type resistors are adequate for most applications. In addition to the SC embodiment of FIG. 6C, the low-pass filter 32 can also be constructed with transconductors (gm-C techniques), or with SI (switched current) circuitry to avoid the use of resistors altogether.

Figure 8:
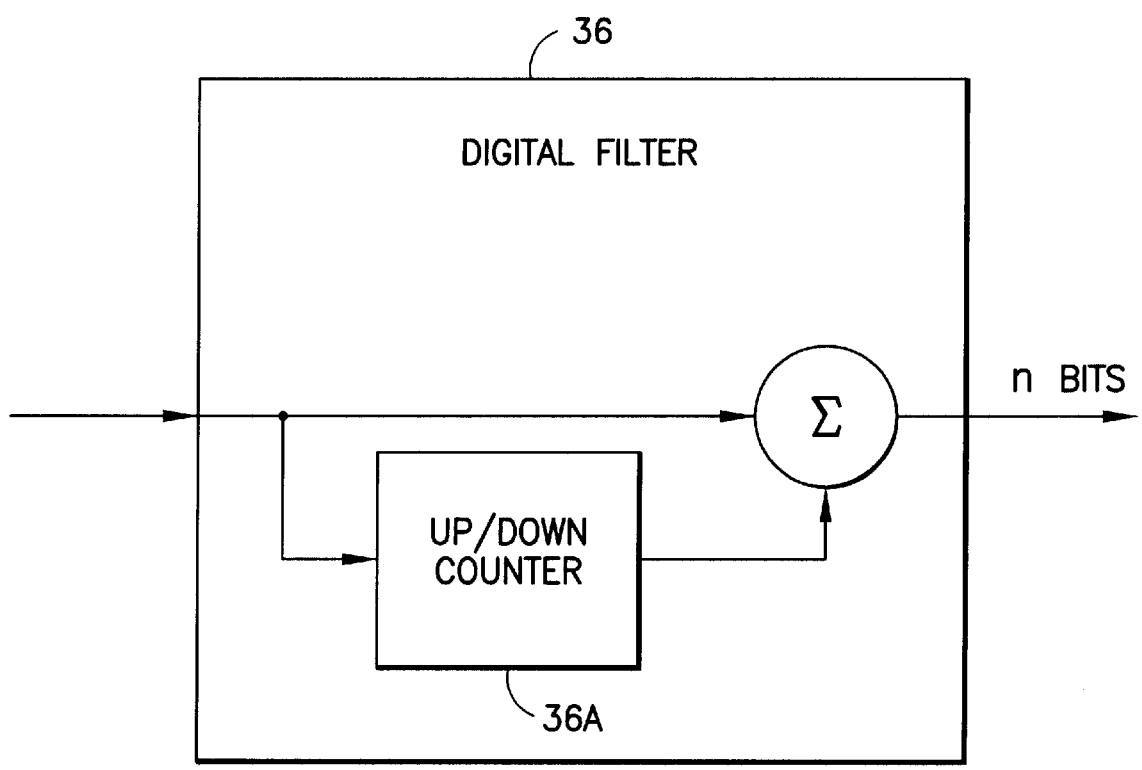
FIG. 8 shows an embodiment of the digital filter of FIG. 5.

The comparator 34 detects the sign of the relative magnitudes at the output terminals in an over-sampled fashion, and the resulting one bit comparator output signal increases or decreases the value at the output of the digital loop filter 36. In general, the digital loop filter 36 outputs a value that increments or decrements as a function of a voltage difference between nodes N1 and N2. In the presently preferred embodiment the digital loop filter 36 is constructed using an up/down counter 36A, as shown in FIG. 8. The value output from the comparator 34 controls the counting direction (up or down) of the up/down counter 36A, and the resulting value output from the digital loop filter 36 is used to switch a corresponding number of DAC 42 stages to sink the current from the replica transistor Mrep 10 so that the voltage difference between nodes N1 and N2 is minimized.

Figure 7:
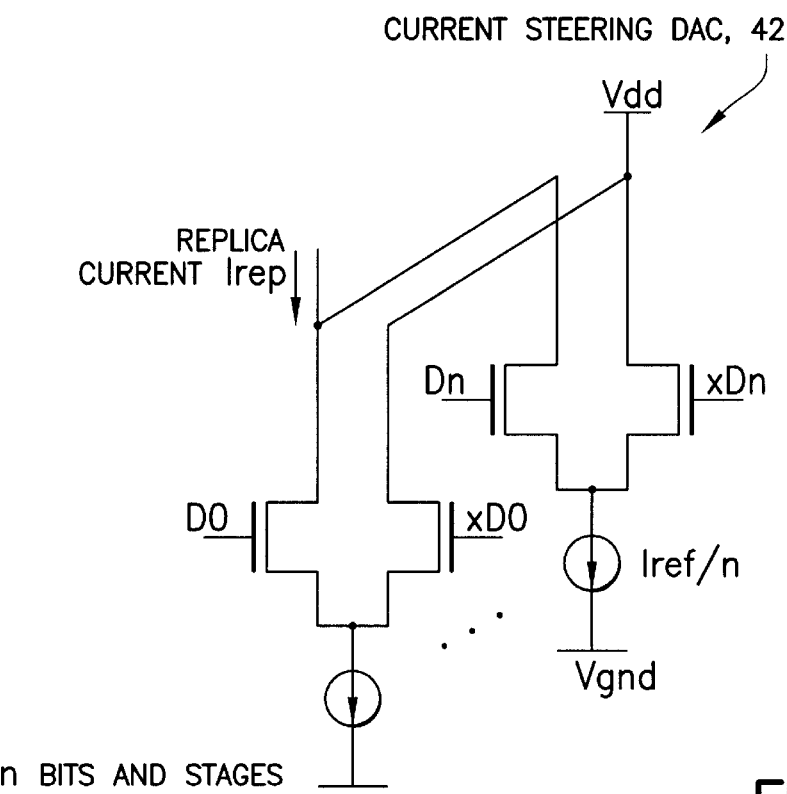
FIG. 7 shows an embodiment of the current steering DAC of FIG. 5.

Referring also to FIG. 7, in operation the output current value of the DAC 42 is equal to the counter 36 output value multiplied by Iref divided by n (the number of stages). The DAC 42 preferably contains a number of current steering DAC stages. The exact number of stages is application specific. As an example, with 16 DAC stages (~4 bits) a better than 10% one-sample resolution is achieved. The reference current Iref defines the measurement range, and is dimensioned so that the total sinking capability of the DAC 42 is equal to the maximum charge current (Ich_max) divided by the mirroring ratio N (i.e., Iref is equal to Ich_max divided by the scaling factor between Msw 2 and Mrep 10).

The Coder/Dem block 42 converts the output word format of the digital filter 36 to a temperature format, and the DEM (dynamic element matching) logic selects which DAC stages are to sink the current. The purpose of the DEM is to average out the possible mismatching of the DAC 42 stages in order to improve the linearity.

It is known to use DEM techniques in the context of sigma-delta converters. Reference in this regard can be had to, for example, U.S. Pat. No. 5,990,819, "D/A converter and delta-sigma D/A converter", by Fujimori and to U.S. Pat. No. 6,011,501, "Circuits, systems and methods for processing data in a one-bit format", by Gong et al. Reference with regard to the DEM technique can be had to chapter 8.3.3 of "Delta-Sigma Data Converters", S. Norsworthy, R. Scherier, G. Temes, IEEE Press (1997), incorporated by reference herein. Dynamic element matching and sigma-delta modulator techniques are both generally well known in the art. The function of the DEM is to operates the switches of the current steering DAC 42 on a random (or a pseudorandom) selection basis so as to randomly distribute the signals forming the thermometer code from the Coder element amongst the n stages of the current steering DAC 42.

The (optional) decimation filter 38 functions to smooth out the "coarse" quantization of the sigma-delta loop 28, and improves the measurement accuracy by averaging several quantization results. Decimation is commonly used in conjunction of sigma-delta modulators and over-sampling. In this application the decimation (or more generally the averaging) function can be implemented with hardware integrated on the same integrated circuit, or in energy management and charging software.

At least one end result of the operation of the circuitry shown in FIG. 5 is to generate the control signal (Vcntl) to be one of the pulse width modulated (PWM) signal having a pulse width that is controlled as a function of the digital output of the closed loop current sink (in addition to a specific battery charging algorithm), or a DC voltage having an adjustable voltage value that is controlled as a function of the digital output of the closed loop current sink (in addition to a specific battery charging algorithm). In this manner the value of Ich is set at an appropriate value for charging the battery 3.

It should be appreciated that these teachings apply as well to the techniques for performing a discharge test on the battery 3, wherein the battery 3 sources current towards a circuit to be powered 20 which functions as a current sink for the current sourced by the battery 3. That is, the current measuring technique in accordance with this invention can be used as well in the circuitry shown in FIG. 4.

While the teachings of this invention have been described in the context of a battery charging circuit used in a wireless terminal, such as a cellular telephone or a personal communicator, those skilled in the art will appreciate that these teachings are not limited to only this one important application, but can instead be employed in a wide range of devices powered by a rechargeable battery, such as personal digital assistants, laptop and notebook computers, and various types of toys.

More generally, these teachings have broad applicability in the field of the measurement of current and the conversion of the measured current value to a digital representation. The invention can be used in any application were a current to be measured is flowing through a switch, such as a transistor, and is, for example, particularly useful in the measurement of the charging current of the battery in a wireless terminal such as a mobile phone. However, the teachings in accordance with this invention can be utilized in other current and power measurement applications, such as in power regulators, power amplifiers and in motor controls, without requiring that resistance be added into the current path. These teachings are also applicable to impedance measurements and, for example, to the detection of high current and short circuit situations. Thus, while these teachings have been described in the context of making a battery charge current measurement, this embodiment should be viewed as being exemplary, and not as being a limitation upon the practice of the teachings of this invention.

As such, while the invention has been particularly shown and described with respect to preferred embodiments thereof, it will be understood by those skilled in the art that changes in form and details may be made therein without departing from the scope of the invention.

What is claimed is:

1. A method for charging a battery, comprising:
   generating at a first node a battery charge current Icharge for charging the battery;
   generating at a second node a replica current Irep from Icharge, where Irep<Icharge; and
   operating a closed loop current sink for sinking Irep, where a digital output of said closed loop current sink is a measure of the magnitude of Icharge.

2. A method as in claim 1, where said digital output is input to a control circuit for controlling the generation of Icharge.

3. A method as in claim 1, where said closed loop current sink is comprised of a multi-stage DAC driven by an output of a digital loop filter that increments or decrements as a function of a voltage difference between said first node and said second node.

4. A method as in claim 3, where a selection of stages of the multi-stage DAC to be turned off and on is made by a dynamic element matching DEM logic block that is interposed between the output of said digital loop filter and said multi-stage DAC.

5. A method as in claim 3, where said digital loop filter is comprised of an up/down counter, and where said multi-stage DAC is comprised of a multi-stage current steering DAC.

6. A method as in claim 1, and further comprising a step of decimating the digital output of said closed loop current sink.

7. A circuit for use in charging a battery, comprising a transistor for providing at a first node a battery charge current Icharge for charging the battery; a replicating circuit for generating at a second node a replica current Irep from Icharge, where Irep<Icharge; and a closed loop current sink for sinking Irep, where a digital output of said closed loop current sink is a measure of the magnitude of Icharge.

8. A circuit as in claim 7, where said digital output is input to a control circuit for controlling the generation of Icharge.

9. A circuit as in claim 7, where said closed loop current sink is comprised of a multi-stage DAC driven by outputs of a digital loop filter having an output that increments or decrements as a function of a voltage difference between said first node and said second node.

10. A circuit as in claim 9, where a selection of stages of the multi-stage DAC to be turned off and on is made by a dynamic element matching DEM logic block that is interposed between the output of said digital loop filter and said multi-stage DAC.

11. A circuit as in claim 9, where said digital loop filter is comprised of an up/down counter, and where said multi-stage DAC is comprised of a multi-stage current steering DAC.

12. A circuit as in claim 7, and further comprising a decimation filter coupled to said digital output of said closed loop current sink.

13. A circuit as in claim 9, and further comprising a filter having a differential input coupled to said first and second nodes, said filter comprising one of a single ended output or a differential output coupled to an input of a comparator, said comparator having an output coupled to an input of said digital loop filter.

14. A method for charging a battery, comprising:
    generating a charging current Ich for a battery;
    generating a replica current Irep of Ich, where Irep=Ich/N, where N>1;
    operating a closed loop current sink for sinking Irep, where a digital output of said closed loop current sink is a measure of the magnitude of Ich; and.
    using the measured magnitude of Ich for controlling the magnitude of Ich.

15. A method as in claim 14, wherein N is greater than about 10.

16. A method as in claim 14, wherein N is greater than about 100.

17. A method as in claim 14, wherein N is in a range of about 100 to about 1000.

18. A method as in claim 14, wherein the step of generating the charging current Ich comprises a step of operating a first device having an input node coupled to a source of charging current, wherein the step of generating the replica current Irep comprises a step of operating a second device having an input node coupled to the source of charging current; and wherein the first device and the second device are both driven with the same control signal.

19. A method as in claim 18, wherein the control signal is one of a pulse width modulated signal having a pulse width that is controlled as a function of the digital output of said closed loop current sink or a DC voltage having an adjustable voltage value that is controlled as a function of the digital output of said closed loop current sink.

20. A method as in claim 18, wherein the step of operating the closed loop current sink comprises a step of operating a closed loop sigma-delta converter to force a voltage appearing at an output node of the second device to equal a voltage appearing at an output node of the first device.

21. A circuit for measuring a battery discharge current, comprising:
    a first device driven by a control signal and having an input node coupled to a battery to be discharged and an output node for coupling a battery discharge current Idisch to a current sink; and
    a second device driven by said control signal and having an input node coupled to said battery and an output node providing a replica current Irep of Idisch, where Irep=Idisch/N, where N>1, said output node of said second device being coupled to a measurement circuit comprised of a closed loop current sink for sinking Irep, where a digital output of said closed loop current sink is a measure of the magnitude of Idisch.

* * * * *